(12) United States Patent
Shih et al.

(10) Patent No.: US 8,283,221 B2
(45) Date of Patent: Oct. 9, 2012

(54) CONFIGURATION AND MANUFACTURING METHOD OF LOW-RESISTANCE GATE STRUCTURES FOR SEMICONDUCTOR DEVICES AND CIRCUITS

(76) Inventors: Ishiang Shih, Brossard (CA); Chunong Qiu, Brossard (CA); Cindy X. Qiu, Brossard (CA); Yi-Chi Shih, Palos Verdes Estates, CA (US)

( * ) Notice: Subject to any disclaimer, the term of this patent is extended or adjusted under 35 U.S.C. 154(b) by 341 days.

(21) Appl. No.: 12/657,602

(22) Filed: Jan. 25, 2010

(65) Prior Publication Data

US 2011/0180850 A1 Jul. 28, 2011

(51) Int. Cl.
*H01L 21/338* (2006.01)
(52) U.S. Cl. ......... 438/182; 438/579; 257/280; 257/284
(58) Field of Classification Search .............. 257/259, 257/280, 284, 499; 438/172, 182, 574, 622, 438/579
See application file for complete search history.

(56) References Cited

U.S. PATENT DOCUMENTS

| | | | | |
|---|---|---|---|---|
| 5,693,548 A * | 12/1997 | Lee et al. | ...... | 438/172 |
| 7,041,541 B2 * | 5/2006 | Behammer | ...... | 438/182 |
| 7,141,464 B2 * | 11/2006 | Park et al. | ...... | 438/182 |
| 7,723,761 B1 * | 5/2010 | Milosavljevic et al. | ...... | 257/280 |
| 2008/0251877 A1 * | 10/2008 | Jain et al. | ...... | 257/499 |

FOREIGN PATENT DOCUMENTS

| EP | 410385 A2 * | 1/1991 |
|---|---|---|
| JP | 05029213 A * | 2/1993 |

* cited by examiner

*Primary Examiner* — Zandra Smith
*Assistant Examiner* — Errol Fernandes (57) ABSTRACT

The present invention provides methods for fabricating devices with low resistance structures involving a lift-off process. A radiation blocking layer is introduced between two resist layers in order to prevent intermixing of the photoresists. Cavities suitable for the formation of low resistance T-gates or L-gates can be obtained by a first exposure, developing, selective etching of blocking layer and a second exposure and developing. In another embodiment, a low resistance gate structure with pillars to enhance mechanical stability or strength is provided.

11 Claims, 8 Drawing Sheets

CONFIGURATION AND MANUFACTURING METHOD OF LOW-RESISTANCE GATE STRUCTURES FOR SEMICONDUCTOR DEVICES AND CIRCUITS

FIELD OF INVENTION

This invention relates to processing and fabrication of semiconductor devices and circuits and more particularly to the fabrication of short gate structure using a radiation blocking layer to separate successive exposures to define respectively stem and head of a gate structure. The invention also relates to a T-gate or a Γ-gate structure having pillars to enhance the mechanical integrity and stability.

BACKGROUND OF THE INVENTION

In electronic circuits and devices for high speed operations, semiconductor substrates with conducting channels are used with gate structures. Voltage applied to the gate structure induces a field effect to modulate the carrier density in the channel. The switching speed of such a field effect device is mainly determined by the $R_g C_g$ time constants in the input terminals and ultimately determined by the transit time of carriers from source to drain. Here, the source and drain are in contact with the two end regions of the channel and define a channel length and a channel width. Therefore, the space available to accommodate the gate is limited to within the channel region (or channel length). To reduce the unwanted capacitance between the gate to the source ($C_{gs}$) and gate to the drain ($C_{gd}$) and hence the total gate capacitance $C_g \approx C_{gs} + C_{gd}$, the length of gate (L) contacting the channel region must be made small. However, for a gate having a small gate length L, the gate series resistance $R_g$ will be large causing a relatively large product of $R_g C_g$. This is because $R_g = r$ (W/L×H), where W is the width and H is the height (or thickness) of the gate. In order to reduce the unwanted $R_g$, the cross sectional area (given by product L×H) of the gate should be increased and this is conveniently achieved by adopting a T-gate structure or an Γ-gate structure. In the T-gate or Γ-gate structure, the vertical portion of the gate contacting the channel is often called the stem or foot whereas the horizontal portion disposed on top of the stem is called the head. Since the head is raised over the channel, the unwanted $C_g$ can be maintained to be small but with a significantly reduced $R_g$. Therefore, in the microelectronic fabrication and processing, it is critical to achieve T-gates or Γ-gates on semiconductor substrates. It is noted in some processes the gates may have a shape of T and are also called Y-gates.

To achieve both the low resistance $R_g$ and stable operation, metals including Au, Ti and Pt in sandwich form are often used to form the gates. Etching methods are often more difficult to achieve the gate with a short length of stem especially on semiconductor substrates having high carrier mobilities, such as InP, GaAs, GaN, InGaAs, AlGaAs, InGaN, AlGaN and InGaP etc. This is due to the compatibility of these semiconductors to the etching solutions or agents used. Therefore, instead of etching, a lift-off process is often used to create the required T-gate or Γ-gate.

Using e-beam writing, the T-gate or Γ-gate may be obtained by using a three-resist configuration. The resists used in e-beam lithography often have molecular weights larger than the resists used in optical lithography. In the three-resist e-beam configuration, the first resist contacting the substrate is selected to have lower sensitivity to the e-beam compared to the second resist layer deposited on top of the first resist layer. A third resist layer is applied on the second resist layer and this third resist layer again has lower sensitivity to the electron beam. After being exposed to a narrow electron beam of a high dose and superimpose with a wider electron beam with a lower dose, a wider region in the second resist may be achieved after the development. However, the above method requires the provision of different resists layers having different sensitivities and thus different molecular chemistry and intermixing difficulties. In order to solve the intermixing problem and to achieve the fine length cavity for the stem, process involving applying, first exposing and developing the first resist of one sensitivity prior to application of second and third resists with different sensitivities has been proposed. A second exposing and developing will create a gate cavity for metal deposition and lift-off. It should be pointed out in production environment, most of the e-beam writers used operates in sequential manner and the writing time is long.

Methods have been proposed for the creation of T-gates or Γ-gates using optical lithography where resists used have smaller molecular weights. In order to obtain small length of stem compared to the head, a first resist layer is applied, exposed and developed to provide a cavity for the stem. After the developing, the first resist is treated to enhance its chemical properties before applying subsequent resist layers, which will be exposed and developed sequentially to create cavity for the head. In this method, it is required that the intermixing between the first resist and the second resist must be kept as small as possible. However, the intermixing may not be avoided by using the same materials for the first resist and the second resist. Even when resists with different molecules or chemistry are employed, the intermixing still cannot be eliminated completely. In other method, it has been proposed to utilize a positive resist for the first layer to define stem or foot cavity and a negative resist to define the cavity for the head. However, the adoption of two resists of different types often lead to difficulties in selecting processing conditions compatible to each other. It is thus highly desirable to have method for the creation of cavities for the T-gates or Γ-gates without any intermixing problems and preferably employing resists of the same materials and chemistry.

SUMMARY OF THE INVENTION

The above-described requirements are substantially met and other advantageous features are provided, according to one embodiment of the invention, by using a method for fabricating devices and circuits with low resistance structures, including the steps of:
(a) providing a semiconducting layer structure; (b) forming a first resist layer on top of said semiconductor structure surface; (c) forming a radiation blocking layer on top of said first resist layer; (d) forming a second resist layer on top of said radiation blocking layer to obtain a bi-layer resist structure sandwiching said radiation blocking layer; (e) exposing selectively a first region of said bi-layer resist structure to a first radiation beam of a certain length to form a second cavity having a central axis in said second resist layer, causing exposure of a portion of said radiation blocking layer; (f) etching said exposed portion of radiation blocking layer not covered by said second resist forming a blocking layer cavity; (g) exposing selectively a second region of said bi-layer resist structure to a second radiation beam of a different length and developing said bi-layer resist structure to form a first cavity, said first cavity, blocking layer cavity and second cavity combined to form a gate opening with an overhang profile created in the second resist layer to facilitate lift-off process; (h) depositing an electrically conductive gate material assembly to substantially fill said gate opening; and (i) removing the first resist layer, radiation blocking layer, second resist layer and a portion of electrically conductive gate material assembly disposed on said second resist layer.

According to another embodiment of this invention, a low resistance gate structure with at least one pillar is provided to enhance mechanical strength and stability of short length channel devices.

DETAILED DESCRIPTION

Part 1:

To lower the requirements for materials, equipment and condition control in the creation of low resistance structure such as T-gate and Γ-gate, the main difficulties include the creation of cavities for the low resistance gates with minimum resist intermixing, employing only one resist type (preferably positive type) that are compatible during developing and subsequent lift-off. The above difficulties are eliminated or greatly reduced using the methods provided in the present invention. Refer now to FIGS. 1 to 6 which illustrate steps of creating cavities for a low resistance gate, and more particularly a T-gate structure, according to this invention. It is noted that like numerals are employed to indicate like elements or regions in different figures in the description of the invention.

Figure 1:
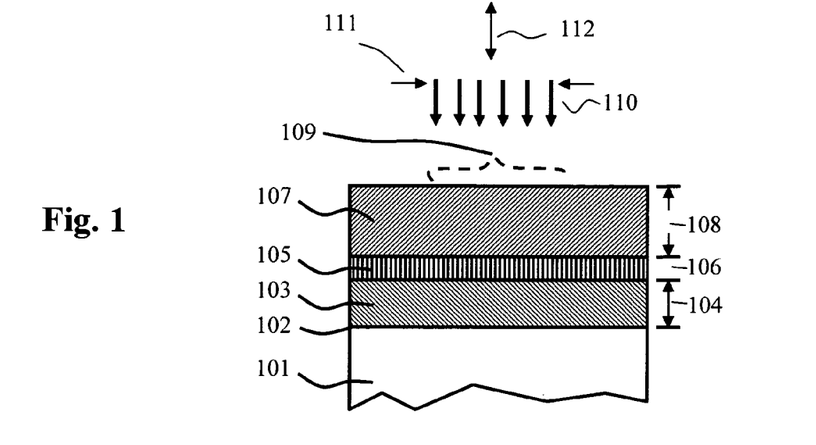
FIG. 1 to FIG. 9 illustrates schematic cross-sectional views of a substrate with resists at different processing steps during the creation of a low resistance T-gate structure according to one embodiment of this invention.

FIG. 1 shows a schematic cross-sectional view of a substrate (101) having a semiconducting layer structure (not shown for simplicity) on a semiconducting structure surface (102). The semiconducting layer structure may be configured for the fabrication of devices and circuits involving high electron mobility transistors, heterojunction bipolar transistors and optoelectronic components. A first resist layer (103) is applied by spin coating or spray coating and baked to remove solvent in the first resist layer so that it has a first resist thickness (104). The first resist material may be low molecular weight optical photo resists preferably sensitive to short wavelength ultraviolet lights, high molecular weight electron resists sensitive to electrons with energies preferably in a range from 20 keV to 100 keV or ion beams. The first resist thickness (104) is controlled according to the height of stem or foot required for the low resistance structure, which will become clear in subsequent parts of the description. A radiation blocking layer (105) is deposited by vacuum evaporation or sputtering on the first resist layer (103) to a blocking layer thickness of (106) so that it is sufficient to block ultraviolet light or electron beams or ion beams. For blocking ultraviolet lights, the radiation blocking layer (105) may be a metal layer such as aluminum (Al) or titanium (Ti) with a thickness in the range of 10 nm to 30 nm so that transmission of the ultraviolet light to be used for exposure will be substantially less than 20%, or more preferably less than 10%. For electron beams, materials with large atomic weight will be used. In order to ensure a good adhesion between the radiation blocking layer (105) and the first resist layer (103), an adhesion layer may be added.

Figure 2:
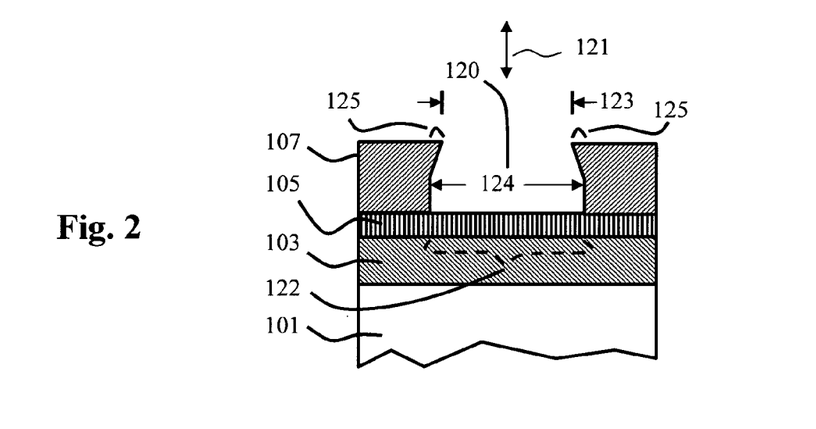

After the deposition of the radiation blocking layer (105), a second resist layer (107) is applied by spin coating or spray coating under controlled conditions to achieve a second resist thickness (108) after baking. The second resist thickness (108) is selected according to the thickness requirements of the head portion of the low resistance structure. It is thus clear that radiation blocking layer (105) is sandwiched between the first resist layer (103) and second resist layer (107). A first region (109) of the multiple layer structure is then exposed to a first radiation beam (110) of ultraviolet light (or an electron beam or ion beam). In subsequent parts, reference will be made to an ultraviolet light beam or light beam to simplify the description. The first radiation beam (110) has a length (111), a central axis (112) and a width (not shown in FIG. 1). After developing, a second resist cavity (120) as shown in FIG. 2 is formed in the second resist layer (107) with a central axis (121), exposing a portion (122) of the radiation blocking layer (105) which is not covered by the second resist (107). It is noted that the top length (123) of second resist cavity (120), which is controlled by the length (111) of the first radiation beam (110), is smaller than the bottom length (124) of the cavity (120) so that there are overhangs (125) to facilitate lift-off of metals to be deposited in the second cavity (120). The overhangs (125) can be achieved either by treating the second resist layer (107) in a base or chlorobenzene so that the developing rate at the surface of (107) after being exposed to the first radiation beam (110) will be less compared to the bulk regions.

Figure 3:
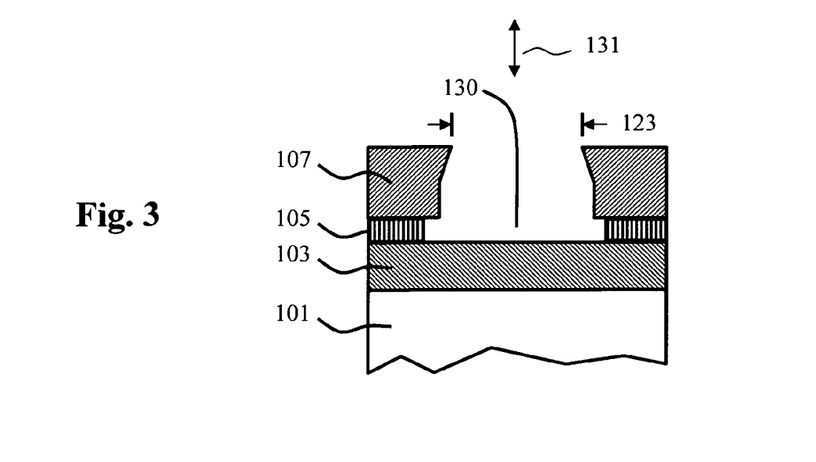
Figure 4:
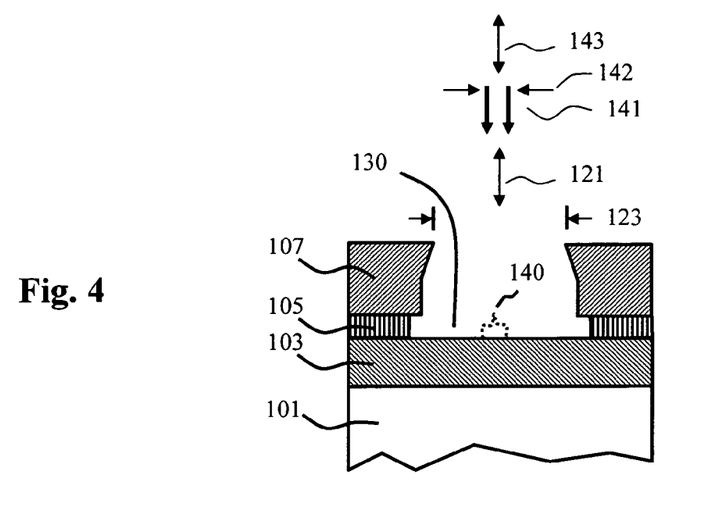
Figure 5:
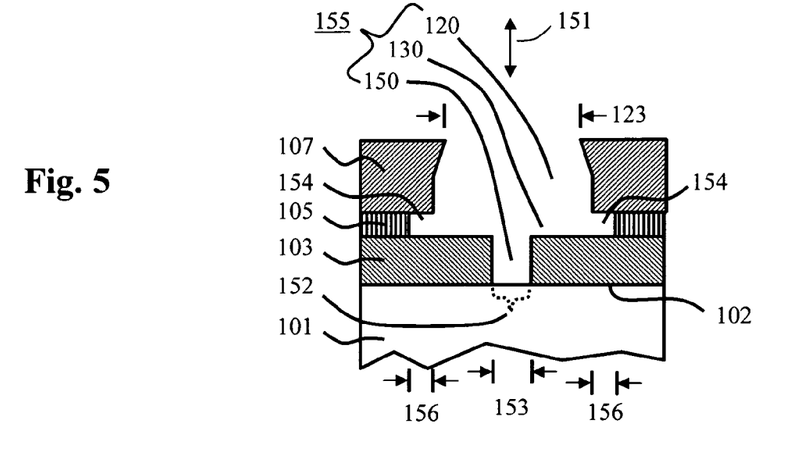

The exposed portion (122) of the radiation blocking layer (105) is then removed by dry etching or wet etching forming a blocking layer cavity (130) having a central axis (131) as shown in FIG. 3. It is noted that the central axis (121) of the second cavity (120) substantially coincides with the central axis (131) of the blocking layer cavity (130). (121) and (131) are also substantially coinciding with the central axis (112) of the first radiation beam (110). After rinsing and drying, as indicated in FIG. 4, a second region (140) of the multiple layer structure is exposed to a second radiation beam (141) having a length (142), a central axis (143) and a width (not shown in FIG. 4). In FIG. 4, the central axis (143) of the second radiation beam (141) is aligned to the central axis (121) of the second cavity (120). However, for certain device structure such as pHEMT or mHEMT, it may be preferable to direct the central axis (143) of the second radiation beam (141) substantially away from the central axis (121) of the second cavity (120) but still within the second cavity (120). The multiple layer structure is then developed after the exposure to the second radiation beam (141) to form a first cavity (150) with a central axis (151) in the first resist layer (103), as illustrated in FIG. 5. A portion (152) of the semiconducting structure surface (102) is thus exposed and not covered by the first resist layer (103). Said portion (152) has a length (153) defined by length (142 in FIG. 4) of the second radiation beam (141), for accepting metal materials to be deposited.

Since the first resist (103) and the second resist (107) are processed at different time and because they are separated by the radiation blocking layer (105), one has the freedom to select the first resist and second resist to be the same type (e.g. positive) or different types.

According to the present invention, in order to facilitate lift-off of unwanted metals for the low resistance structure, it is preferable to etch the exposed radiation blocking layer (122 in FIG. 2) to create undercuts (154) between the first resist layer (103) and second resist layer (107).

The first cavity (150), the blocking layer cavity (130) and the second cavity (120) combine into an integral cavity (155), which is ready for the deposition of metals to fill substantially said integral cavity (155). The metals are subsequently lift-off to form low resistance structure on the substrate (101). It is noted that dimension (156) of the undercuts (154) is selected during etching of the radiation blocking layer (105) and is sufficient for lifting-off unwanted low resistance metals to form the desired low resistance structure.

Figure 6:
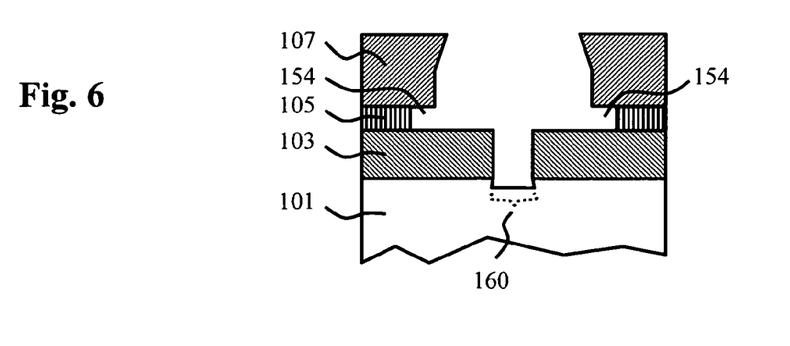
Figure 7:
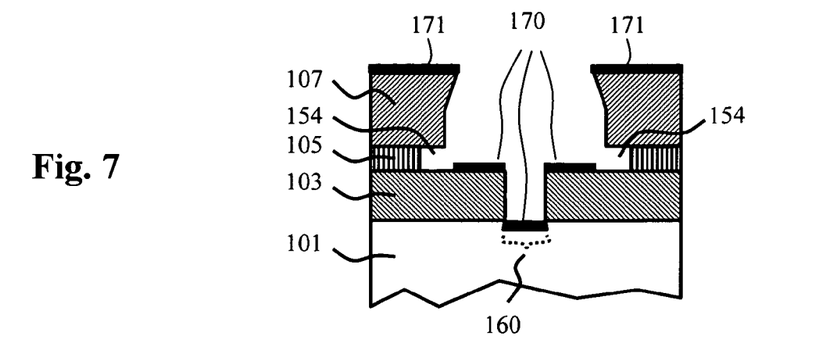
Figure 8:
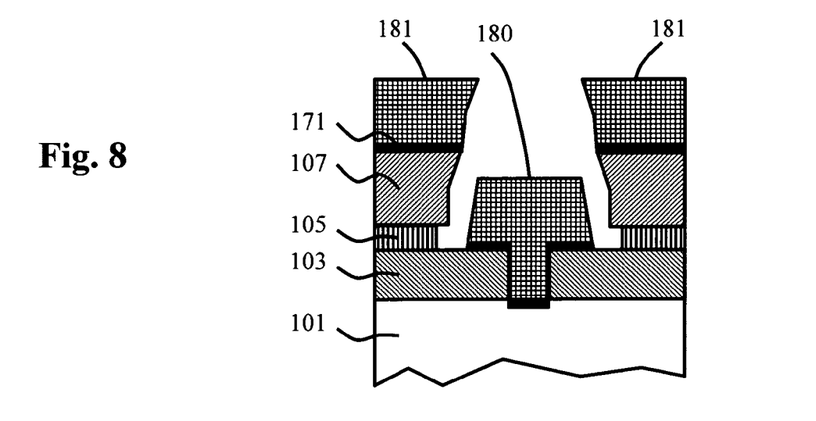
Figure 9:
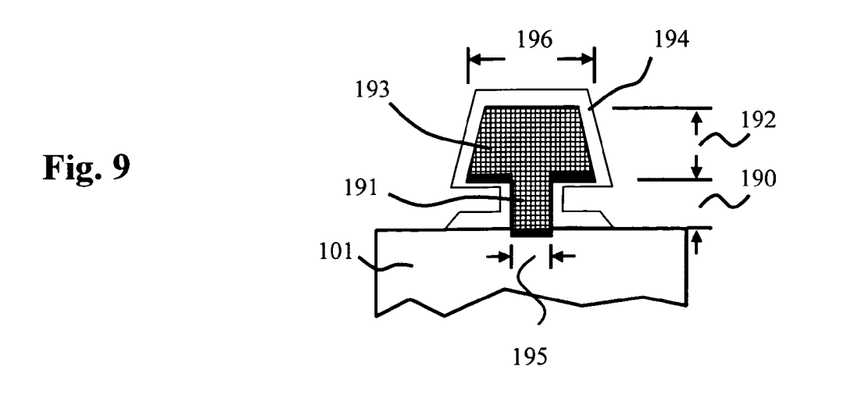

Prior to the deposition of low resistance metals, it is beneficial to form a recess (160) indicated in FIG. 6, in the exposed semiconductor layer structure. The forming of the recess (160) is often achieved by wet etching or dry etching to a depth either control by an etch-stop or an etching time. As illustrated in FIG. 7, an adhesion layer (170, 171) is then deposit over the entire substrate surface to cover the etched recess (160), a portion of the first resist layer (103) and a portion of the second resist layer (107). The purpose of the adhesion layer (170) is to improve adhesion between the low resistance metals and the semiconductor surface. Conducting metal's (180, 181 see FIG. 8) such as platinum and gold multiple layers are then deposited either by vacuum deposition or electroplating. To obtain free-standing low resistance structure, the substrate is immerse in a solvent to dissolve both the first resist layer (103) and the second resist layer (107) and to remove the remaining radiation blocking layer (105) and unwanted metals (181) with adhesion layer (171). A free standing low resistance structure is shown in FIG. 9, where the height (190) of stem or foot portion (191) is substantially equal to the first resist thickness (104, FIG. 1), the height (192) of head portion (193) is determined by the amount of metals and adhesion layer deposited and is normally smaller than the combination of second resist thickness (108) and blocking layer thickness (106). In the low resist structure, the length (195) of the foot portion (191) is substantially defined by the first cavity length (153, FIG. 5) and the length (196) of the head portion (193) is smaller than the second cavity length (124, FIG. 2). To enhance the integrity during operation, a layer (194) of passivation material such as silicon nitride may be deposited.

With the adoption of the radiation blocking layer (105), the intermixing effects between the first resist layer (103) and the second resist layer (107) are eliminated. More importantly, the method of creating low resistance structure according to this invention allows one to expose the first resist layer for the creation of stem portion or foot portion without subjecting the first resist layer (103) to the developer used to create the second cavity (120) in the second resist layer (107). Therefore, the dimensions, contours or line width of patterns in the first resist layer (103) can be maintained. It should be noted that these dimensions, contours or line width in the first resist layer (103) critically defines the shape and dimensions of stem or foot portion of the low resistance structure. Hence, the unwanted capacitive parasitic components associated with the low resistance structure can be controlled in a more uniform and reproducible manner.

Figure 10:
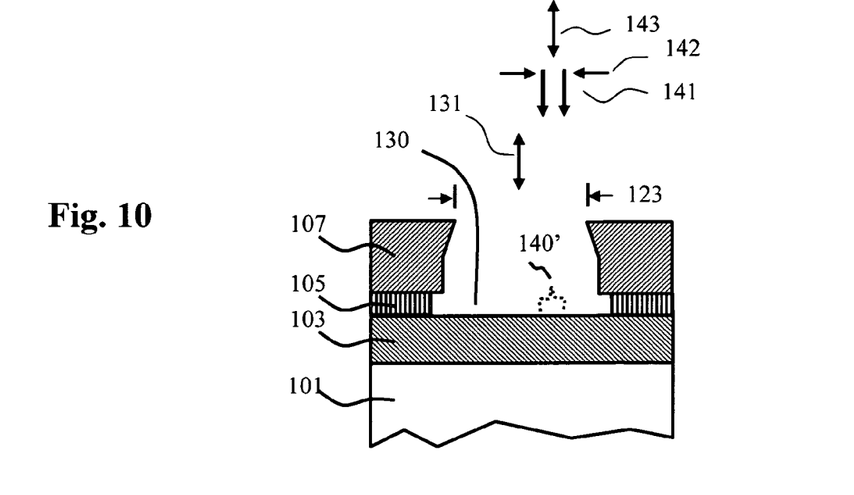
FIG. 10 to FIG. 12 illustrates schematic cross-sectional views of the substrate with resists at different processing steps of forming a low resistance Γ-gate structure according to another embodiment of this invention.
Figure 11:
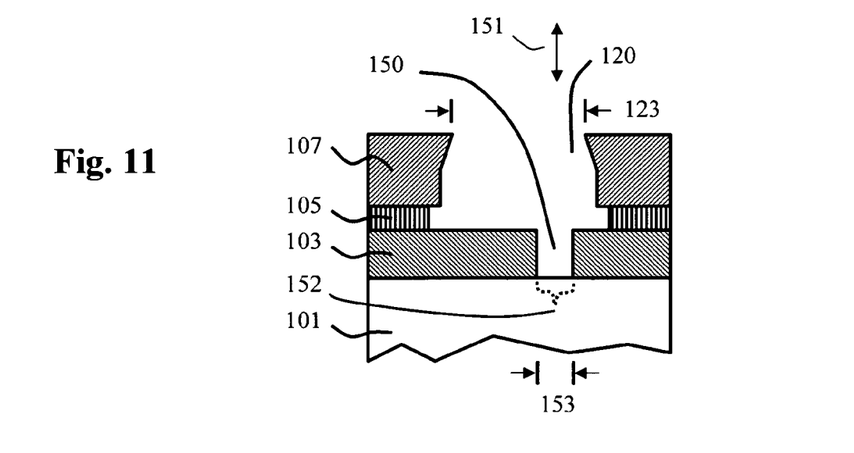
Figure 12:
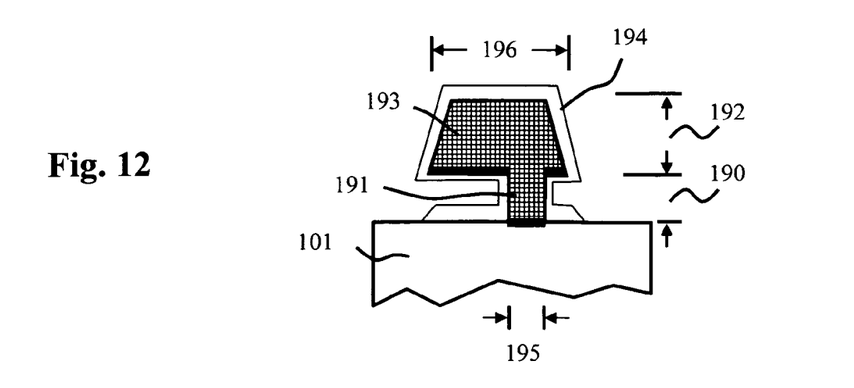

For certain circuit applications where the minimizing of unwanted parasitic components is critical to achieve ultimate frequency performance, it is required to place the head portion in the low resistance structure substantially away from the drain of a HEMT. As shown in FIG. 10, this is achieved in this invention by aligning the second radiation beam (141) of length (142) onto a second region (140') in such a manner that the central axis (143) of the second radiation beam (141) is substantially away from the central axis (131) of the blocking layer cavity (130). After development and rinsing to create a first cavity (150 in FIG. 11) with a central axis (151) in alignment with the central axis (143) of the second radiation beam (141, FIG. 10), recess etching is performed to remove a layer of material from the semiconductor substrate in the exposed region (152) of a length (153). This will be followed by the deposition of an adhesion layer and low resistance metals. After unwanted metals, adhesion layer, radiation blocking layer, the first resist layer and the second resist layer are removed by immersing the substrate in a solvent, a complete low resistance structure is shown in FIG. 12 where the central axis of the stem or foot (191) is clearly away from the central axis of the head portion (193).

Figure 13:
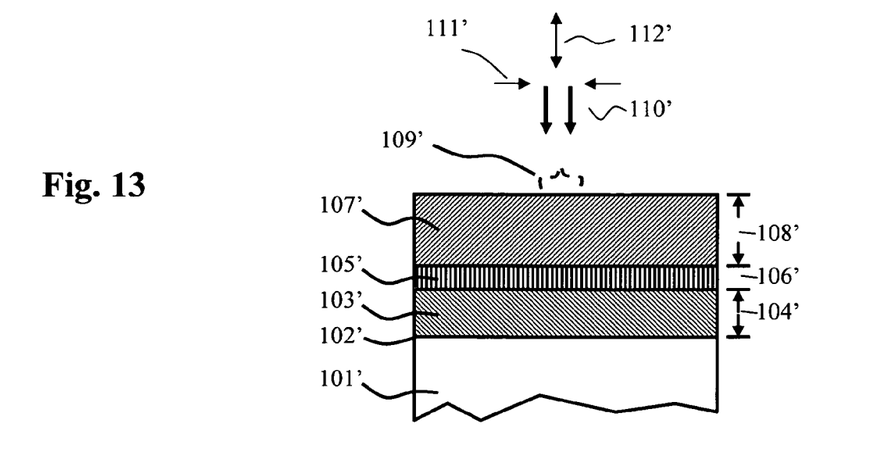
FIG. 13 to FIG. 18 illustrates schematic cross-sectional views of the substrate with resists at different processing steps during the creation of a low resistance T-gate structure according to yet another embodiment of this invention.

Part 2:

According to another embodiment of this invention, the position and length of the first cavity are defined by position and length of the radiation blocking cavity. Referring to FIG. 13 where a schematic cross-sectional view of a substrate (101') is shown having a semiconducting layer structure (not shown) on a semiconducting structure surface (102'). The semiconducting layer structure may be configured for the fabrication of devices and circuits involving high electron mobility transistors, heterojunction bipolar transistors and optoelectronic components. A first resist layer (103') is applied by spin coating or spray coating and baked to remove solvent in the first resist layer (103') so that it has a first resist thickness (104'). Material of the first resist layer may be low molecular weight optical photo resists preferably sensitive to short wavelength ultraviolet lights, high molecular weight electron resists sensitive to electrons with energies preferably in a range from 20 keV to 100 keV or ion beams. The first resist thickness (104') is controlled according to the height of stem or foot required for the low resistance structure, which will become clear in subsequent parts of the description. A radiation blocking layer (105') is deposited by vacuum evaporation or sputtering on the first resist layer (103') to a blocking layer thickness of (106') so that it is sufficient to block ultraviolet light or electron beams or ion beams from entering the first resist layer (103'). For blocking ultraviolet lights, the radiation blocking layer may be a metal layer such as aluminum (Al) or titanium (Ti) with a thickness in the range of 10 nm to 30 nm so that transmission of ultraviolet light through the blocking layer will be substantially less than 20% or more preferably less than 10%. For electron beams, materials with large atomic weight will be used.

Figure 14:
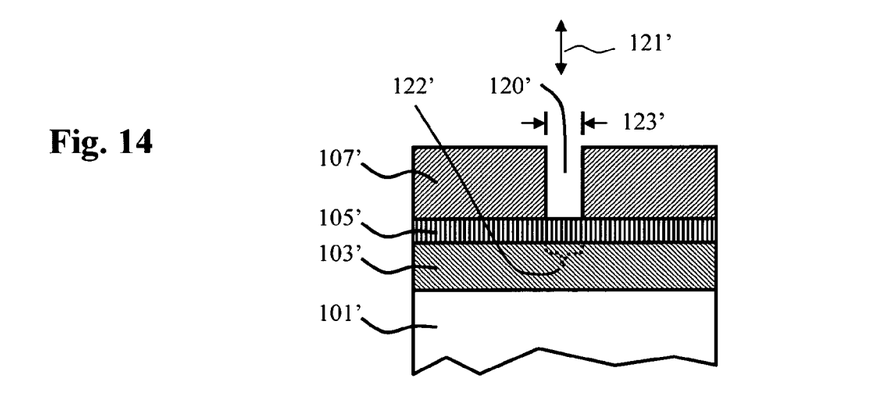

After the deposition of the radiation blocking layer (105'), a second resist layer (107') is applied by spin coating or spray coating under controlled conditions to achieve a second resist thickness (108') after baking. The second resist (107') is selected to be the same type as the first resist (105') and is compatible during developing and lift-off. The second resist thickness (108') is selected according to the requirements of the thickness of the head portion of the low resistance structure. It is thus clear that radiation blocking layer (105') is sandwiched between the first resist layer (103') and the second resist layer (107'). A first region (109') of the multiple layer structure is then exposed to a first radiation beam (110') of ultraviolet light, an electron beam or ion beam. In subsequent parts, reference will be made to an ultraviolet light beam or light beam to simplify the description. The first radiation beam (110') has a length (111') a central axis (112') and a width (not shown in FIG. 13). After developing, as indicated in FIG. 14, a second cavity (120') is formed in the second resist layer (107') with a central axis (121'), exposing an portion (122') of the radiation blocking layer (105') which is not covered by the second resist (107'). It is noted that the length (123') of the second resist cavity (120') is defined by the length (110') of the first radiation beam (110') and it is controlled to be substantially uniform form top to bottom.

Figure 15:
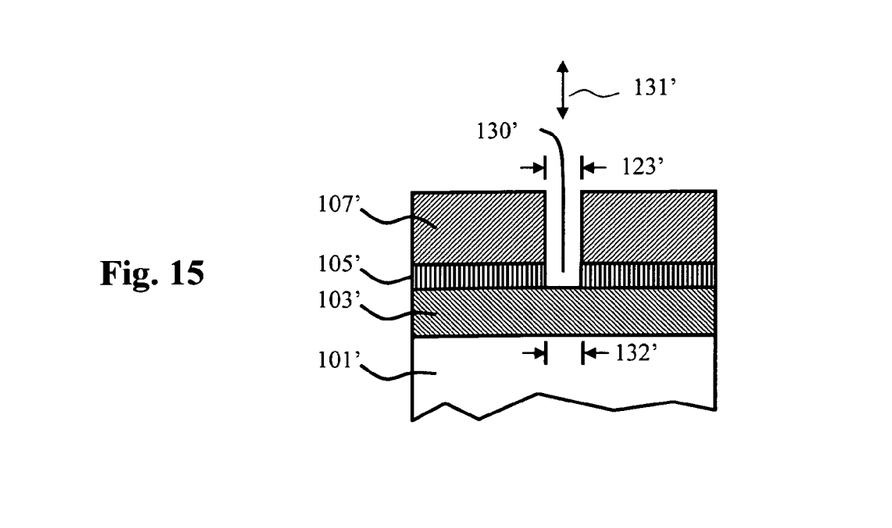
Figure 16:
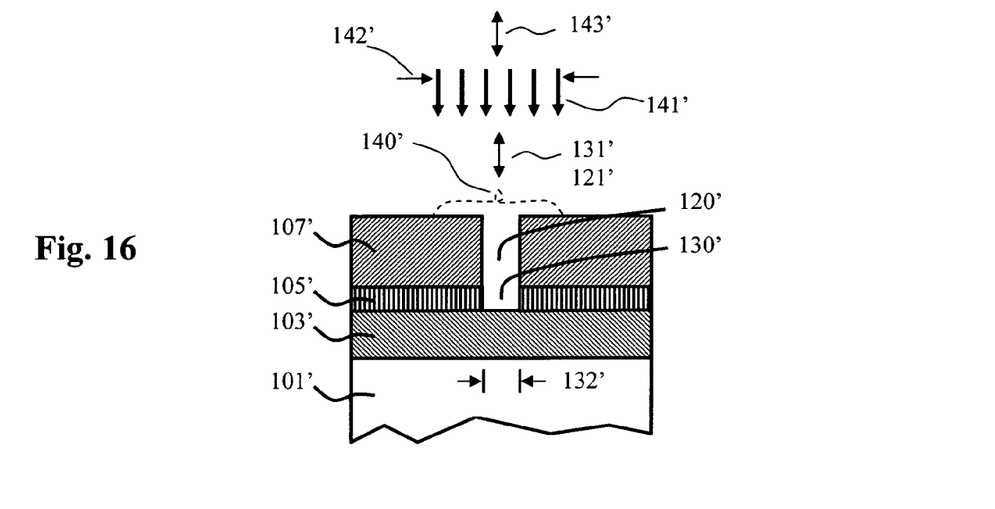
Figure 17:
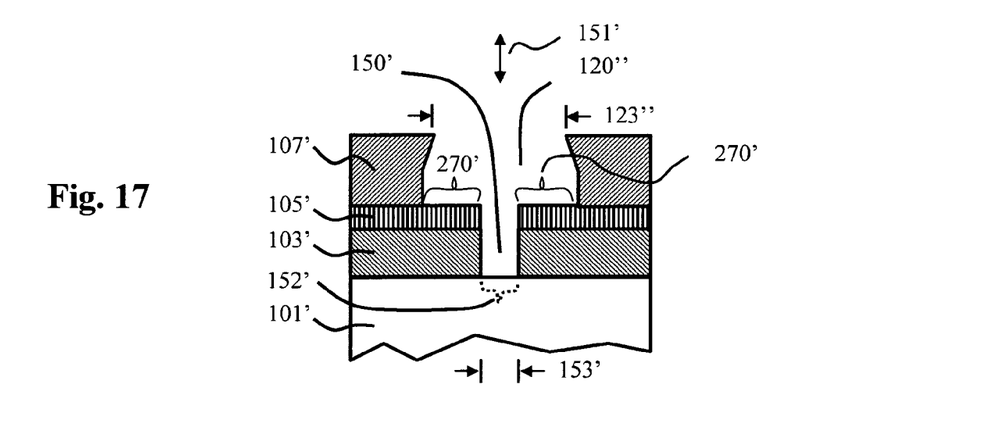

The exposed portion (122') of the radiation blocking layer (105') is then removed by dry etching or wet etching forming, a first blocking layer cavity (130', FIG. 15) having a central axis (131') and a length (132'). The length (132') is defined by the length (123') of the second resist cavity (120') and ultimately defined by the length (111') of the first radiation beam (110'). It is noted that the central axis (121', FIG. 14) in the second resist cavity (120') substantially coincides with the central axis (131') of the first blocking layer cavity (130'). After rinsing and drying, a second region (140', FIG. 16) of the multiple layer structure is exposed to a second radiation beam (141') having a second radiation beam length (142'), a central axis (143') and a width (not shown in FIG. 16), where the second radiation beam length (142') is larger than the first radiation beam length (111') and the length (123', FIG. 15). As illustrated in FIG. 16, the central axis (143') of the second radiation beam (141') is aligned to the central axis (121') of the second resist cavity (120') and also to the central axis (131') of the first blocking layer cavity (130'). However, for certain device structure such as pHEMT or mHEMT, it may be preferable to direct the central axis (143') of the second radiation beam (141') substantially away from the central axis (131') of the first blocking layer cavity (130') but with the central axis (131') still within the second radiation beam length (142'). The multiple layer structure is then developed after the exposure to the second radiation beam (141') to form a first cavity (150' in FIG. 17) in the first resist layer (103') and a new second cavity (120") with a top dimension (123") in the second resist layer (107'). The central axis (151') of the first cavity (150') is in alignment with the central axis (143') of the second radiation beam (141'). It is noted that the length (153') of the first cavity (150') is defined by the length (132') of the first blocking layer cavity (130') and therefore by the length (123', FIG. 14) of the old second cavity (120') in the second resist layer (107') (see FIGS. 14, 16 and 17). A semiconducting portion (152') is thus exposed and not covered by the first resist layer (103'). It is noted that said semiconducting portion (152') has a length (153') defined by length (111') of the first radiation beam (110') and not by the length (142') of the second radiation beam (141'). Prior to metal deposition, the exposed potions (270') of the radiation blocking layer (105') are etched away (see FIG. 18), forming a new blocking layer cavity (130", FIG. 18).

Figure 18:
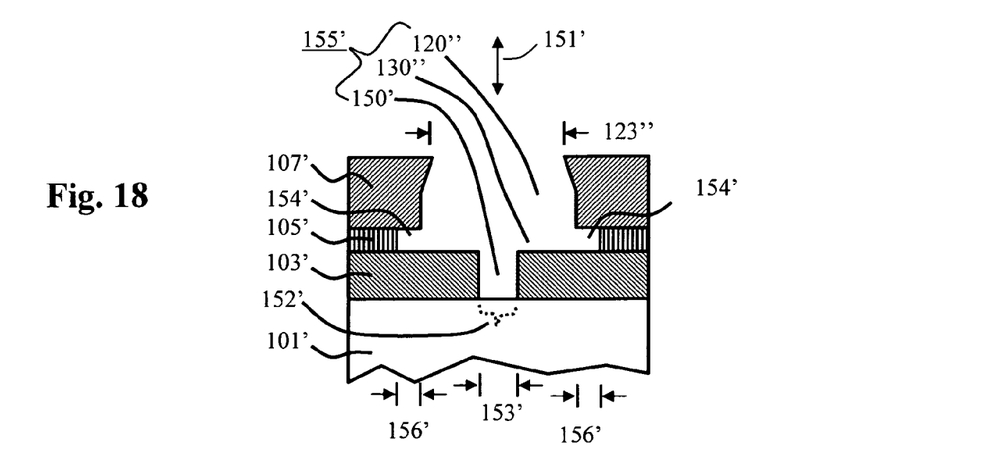

According to this invention as shown in FIG. 18, in order to facilitate lift-off of unwanted metals for the low resistance structure, it is preferable to create undercuts (154') between the first resist layer (103') and the second resist layer (107') while etching the exposed potions (270', FIG. 17) of the radiation blocking layer (105').

The first cavity (150'), the new blocking layer cavity (130") and the new second cavity (120") combined into an integral cavity (155') which is ready for the deposition of metals to substantially fill said integral cavity and subsequent lift-off to form low resistance structure on the substrate (101'). It is noted that dimension (156') of undercuts (154') is defined during the etching of the exposed potions (270', FIG. 17) of the radiation blocking layer (105') and is sufficient to allow for lift-off after the deposition of metals for the low resistance structure.

Prior to the deposition of low resistance metals, it is beneficial to form a recess in the exposed semiconductor layer structure (152'). Furthermore, it is beneficial to deposit an adhesion layer to enhance strength of the low resistance metal structure. Metal materials are then deposited by vacuum evaporation or electroplating to a controlled thickness. To obtain free standing low resistance structure, the substrate is immersed in a solvent to dissolve both the first resist layer (103') and second resist layer (107') and to remove the remaining radiation blocking layer (105') and also the unwanted metals and adhesion layer. To enhance the integrity during operation, a layer of passivation material such as silicon nitride may be deposited.

With the adoption of the radiation blocking layer (105'), the intermixing effects between the first resist layer (103') and the second resist layer (107') during forming of integral cavity (155') can be eliminated. More importantly, the method of creating low resistance structure according to this invention allows one to expose the first resist layer (103') for the creation of stem portion or foot portion without subjecting the first resist layer (103') to the developer more than once, in view of the fact that during the creation of the old second cavity (120') in the second resist layer (107') it is protected by the radiation blocking layer (105') and since the new second cavity (120") is created at the same time as the first cavity (150') in the first resist layer (103'). Therefore, the dimensions, contours or line width of patterns in the first resist layer (103') can be maintained. It should be noted that these dimensions, contours or line width in the first resist layer critically defines the shape and dimensions of stem or foot portion of the low resistance structure. Hence, the unwanted capacitive parasitic components associated with the low resistance structure can be controlled in a more uniform and reproducible manner.

For certain circuit applications where the minimizing of the unwanted parasitic components are needed to achieve ultimate frequency performance, it is required to place the head portion in the low resistance structure substantially away from the drain of a HEMT. This may be conveniently achieved in this invention by aligning the second radiation beam (141') onto a second region (140') in such a manner that the central axis (143') of the second radiation beam (141') is substantially away from the central axis (131') of the old blocking layer cavity (130'), yet (131') is still within the length (142') of the second radiation beam (141'). After development and rinsing to create a new second cavity (120") and a first cavity (150'), the exposed portion of the radiation blocking layer is etched away to create undercuts between the first resist layer (103') and the second resist layer (107') and recess etching is performed to remove a layer of material from the semiconductor substrate. This will be followed by the deposition of an adhesion layer and low resistance metals. Unwanted metals, adhesion layer, radiation blocking layer, the first resist layer and the second resist layer are removed by immersing the substrate in a solvent to form a complete low resistance structure where the central axis of the stem or foot is away from the central axis of the hear portion.

Figure 19:
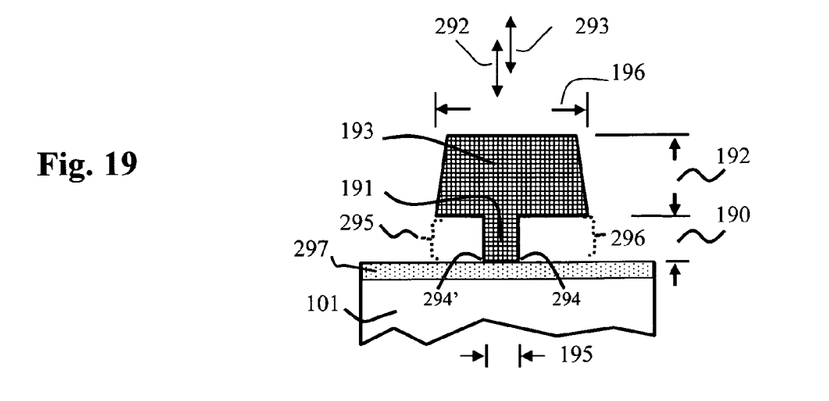
FIG. 19 shows a low resist T-gate structure with a first overhang space, a second overhang space and a reduced contact area in the stem to the substrate.

Part 3:

In FIG. 19, a low resistance structure is shown to have a stem or foot portion (191) with a stem height (190), a stem length (195) and a stem central axis (292). It also has a head portion (193) with a height (192), a head length (196) and a head central axis (293) which is not in alignment with the stem central axis (292). For high speed operations, the stem length (195) of the low resistance structure contacting a semiconductor substrate (101) should be made small, with a stem length value in a range from 20 nm to 150 nm. However, in order to provide sufficient amount of power, width of the low resistance structure (refer to (310) in FIG. 21) should be sufficiently large and being generally in the order of 100 times to 1000 times of the value of the stem length (195). Therefore, due to the small stem length (195) and the relatively large head length (196) along with the asymmetric nature of the low resistance structure in some cases, the strain or stresses in the bottom stem region (294 on the right side and 294' on the left side) contacting the substrate (101) is large, especially during processing involving viscous liquid like photoresist, or in situations with vibrations or shocks. Therefore, for devices with very small stem length (195), adhesion at the bottom of the stem or foot may not be sufficient to withstand the processing or operation conditions and the low resistance structure may tilt toward a first overhang space (295) defined between the stem (191) and left portion of the head (193) or toward a second overhang space (296) defined between the stem and right portion of the head. In extreme situations, the low resistance structure may even detach itself from the substrate surface. When the above conditions occur, the low resistance structure may not effect modulation of carriers in a channel (297) disposed substantially near the top surface of the substrate (101).

Figure 20:
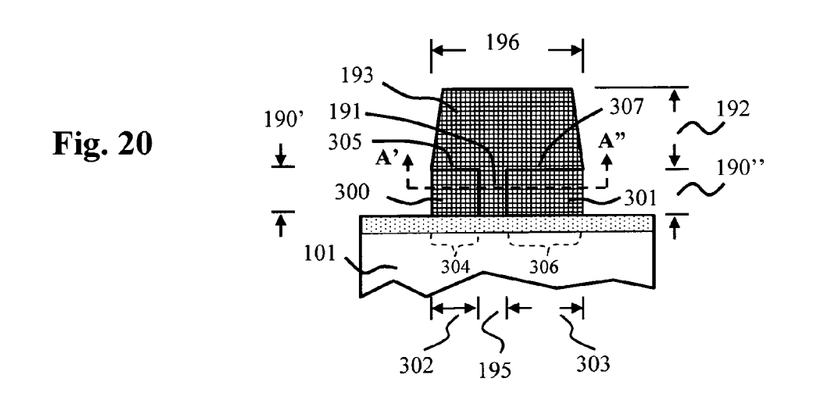
FIG. 20 shows a schematic cross-sectional view of a low resistance T-gate structure with two pillars to enhance its mechanical strength and stability.
Figure 21:
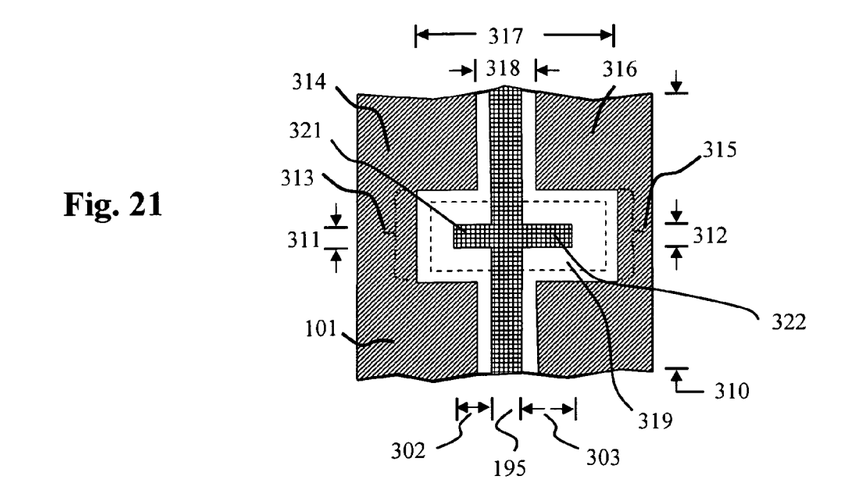
FIG. 21 illustrates schematic top view along the line A'-A" of the low resistance structure in FIG. 20, showing two pillars of rectangular footprints and an in-activated channel region.

In order to increase the strength of the low resistance structure against forces or torques during processing or operation, as shown in FIG. 20 according to this invention, a first group pillar (300) consisting of at least one first pillar, is deposited in a portion of said first overhang space (295, in FIG. 19), each of said first group pillars (300) has a first group pillar height (190'), a first group pillar length (302) and a first group pillar width (311 in FIG. 21). The first group pillar height (190') is substantially equal to the stem height (190, FIG. 19) and the first group pillar length (302) is substantially equal to the length of the first overhang space (295). Said first group pillar (300) contacts a first substrate portion (304) and a first head portion (305) to enhance strength of said low resistance structure. According to another embodiment of this invention, a second group pillar (301) consisting of at least one second pillar, is deposited in a portion of said second overhang space (296, in FIG. 19), each of said second group pillars (301) has a second group pillar height (190"), a second group pillar length (303) and a second group pillar width (312 in FIG. 21). The second group pillar height (190") is substantially equal to the stem height (190, FIG. 19) and the second group pillar length (303) is substantially equal to the length of the second overhang space (296). Said second group pillar (301) contacts a second substrate portion (306) and a second head portion (307) to enhance strength of said low resistance structure.

To simplify the fabrication, the first group pillars (300) and second group pillars (301) are deposited in the same fabrication run for the low resistance metals. Therefore, the materials or structure of the first group pillars (300) and the second group pillars (301) are the same as that for the stem or foot portion. In order to avoid the unwanted electric effects due to the first group pillars and second group pillars, charge carriers in channel (297) immediately below said first group pillars (300), second group pillars (301), portion of stem and a surrounding area must be removed, dispersed or in-activated, (refer now to FIG. 21, which is a top view along the A'-A" line of the structure shown in FIG. 20). This is required so that these charge carriers will not move from a first source portion (313) in the source (314) to a first drain portion (315) in the drain (316). If these above-mentioned charge carriers were allowed to move from the first source portion (313) to the first drain portion (315), unwanted noises will be generated due to the large induced channel length (317) in the pillar region (319, defined by the dotted rectangular area) as compared to the normal channel length (318) induced under the stem (191, FIG. 20). According to this invention, charge carriers in the pillar region (319) are removed or in-activated through an etching process to remove the channel layer and also an adjacent source providing layer within the pillar region (319). The charge carriers in the pillar region (319) may also be removed, dispersed or in-activated by ion implantation in selected areas using energetic ions of various elements.

Figure 22:
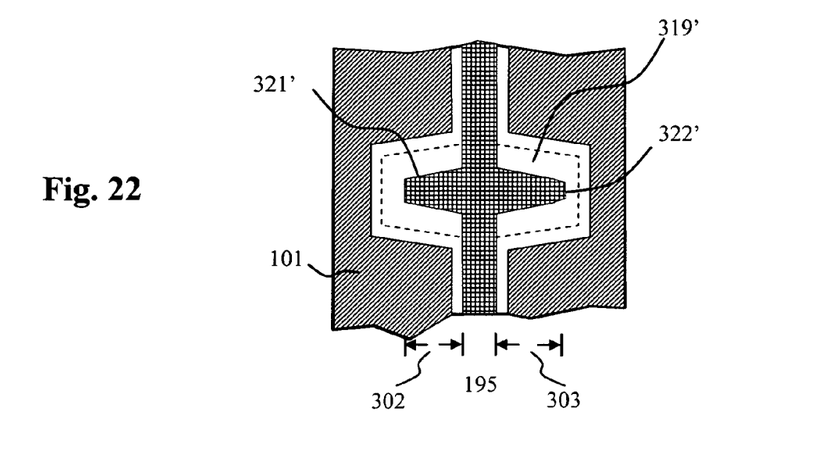
FIG. 22 shows schematic top view along the line A'-A" of the low resistance structure in FIG. 20, showing two pillars with trapezoid footprints and an in-activated channel region.

In FIG. 21, the shape of footprints (321, 322) of the first group pillars (300) and the second group pillars (301) is rectangular. According to yet another embodiment of this invention, footprint of each said first group pillar and second group pillar can also take other shapes. As an example, in FIG. 22, foot prints (321', 322') of trapezoid shape for both the first group pillars (300) and the second group pillars (301) have been illustrated in the pillar region (319'). It should be noted that shapes other than four-sided figures (rectangle, square, trapezoid, lozenge and parallelogram) may also be used as long as they can enhance the strength of the low resistance structure and can be fabricated in the processing steps for the stem (191). Other than solid shapes, the group pillars can also be of hollow forms.

Figure 23:
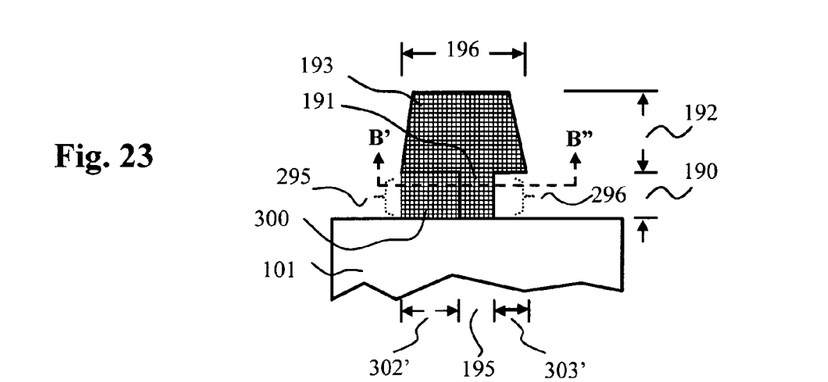
FIG. 23 is a non-symmetrical low resistance structure with only one supporting pillar.
Figure 24:
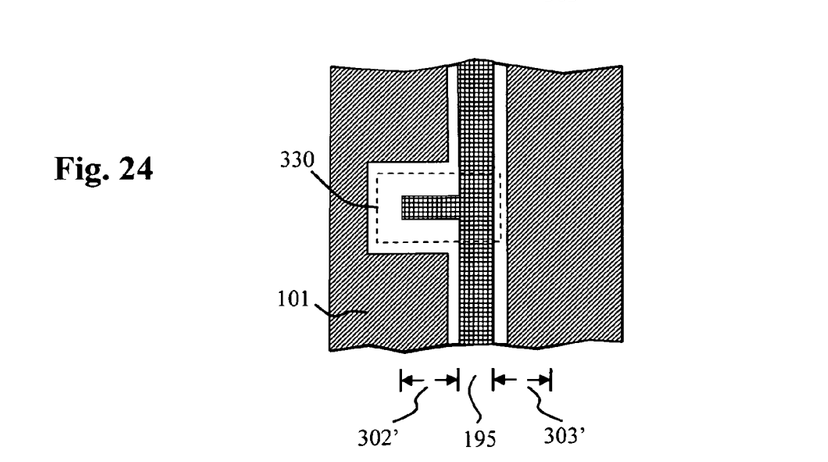
FIG. 24 is a top view along the line B'-B" of the non-symmetrical low resistance structure in FIG. 23, showing one pillar and an in-activated channel region.

For non-symmetrical low resistance structure where length (302') of the first overhang space (295) is substantially longer than the length (303') of the second overhang space (296), it may be sufficient to dispose only the first group pillars (300) as indicated in FIG. 23. Since the second overhang space length (303') is substantially smaller than the first overhang space length (302'), the strength of the low resistance structure can be sufficiently enhanced even with only the first group pillar (300). In such situation, the channel area (330, FIG. 24) to be in-activated or from where the charge carriers must be removed or disposed will be located only to the left hand side.

Although the description of the present invention is made with reference to a device have a channel layer on a substrate, the methods provided for low resistance structure may as well be utilized in the fabrication of devices and circuits based on heterojunction bipolar transistors (HBT), metal-oxide-semiconductor field effect transistor (MOSFET) and pseudomorphic high electron mobility transistors (pHEMT) and metamorphic high electron mobility transistors (mHEMT), various optoelectronic devices and their combinations. Therefore, the spirit of the present invention should not be considered to be limited to the field effect transistors.

What is claimed is:

1. A process for fabricating a low-resistance gate structure, comprising the steps of
   (a) providing a semiconductor layer structure having a semiconductor structure surface;
   (b) forming a first resist layer having a first resist thickness on top of said semiconductor structure surface;
   (c) forming a radiation blocking layer having a radiation blocking layer thickness on top of said first resist layer;

(d) forming a second resist layer having a second resist thickness on top of said radiation blocking layer to obtain a bi-layer resist structure sandwiching said radiation blocking layer;

(e) exposing selectively a first region of said bi-layer resist structure to a first radiation beam having a first radiation beam length and a first radiation beam width and developing said bi-layer resist structure to form a second cavity having a second cavity length and a second central axis in said second resist layer, causing exposure of a portion of said radiation blocking layer;

(f) etching said exposed portion of radiation blocking layer not covered by said second resist to form a radiation blocking layer cavity;

(g) exposing selectively a second region of said bi-layer resist structure to a second radiation beam having a second radiation beam length and second radiation beam width and developing said bi-layer resist structure to form a first cavity having a first cavity length and a first central axis in said first resist layer and an enlarged second cavity in said second resist layer, said second radiation beam length is substantially greater than said first radiation beam length, causing an increase in said second cavity length so that length of said enlarged second cavity is substantially larger than said first cavity length after step (g);

(h) etching exposed radiation blocking layer caused by said increase in said length of said enlarged second cavity to form an enlarged radiation blocking layer cavity; wherein said first cavity, said enlarged radiation blocking layer cavity and said enlarged second cavity combined to form a gate opening;

(i) depositing an electrically conductive gate material assembly to substantially fill said-gate opening; and (j) removing the first resist layer, radiation blocking layer, second resist layer and a portion of electrically conductive gate material assembly on said second resist layer to complete the fabrication of a free-standing low resistance structure having a stem portion with a stem height defined by said first resist thickness and a stem length, a head portion with a head height and a head length, a first overhang space between said stem and a first side of said head, and a second overhang space between said stem and a second side of said head.

2. A process for fabricating a low-resistance gate structure as defined in claim 1, wherein said radiation beam is selected from a group comprising ultraviolet light beam, electron beam and ion beam.

3. A process for fabricating a low-resistance gate structure as defined in claim 1, said second central axis of said enlarged second cavity and said first central axis of said first cavity is aligned, forming a symmetric low-resistance T-gate structure.

4. A process for fabricating a low-resistance gate structure as defined in claim 1, wherein said second central axis of said enlarged second cavity is not aligned with said first central axis of said first cavity, forming low-resistance gate structure with its central axis of the stem portion away from the central axis of the head portion.

5. A process for fabricating a low-resistance gate structure as defined in claim 1, wherein said first resist thickness being selected according to said stem height, said second resist thickness being selected to be substantially greater than said head height, said radiation blocking layer thickness is selected so that unwanted transmission of said first radiation beam and said second radiation beam through said radiation blocking layer is substantially less than 20%.

6. A process for fabricating a low-resistance gate structure as defined in claim 1, wherein step (g) further comprises a sub-step of etching said radiation blocking layer to form undercuts between said first resist layer and said second resist layer.

7. A process for fabricating a low-resistance gate structure as defined in claim 1, wherein said conductive gate material assembly further including an adhesion layer and a passivation layer.

8. A process for fabricating a low-resistance gate structure as defined in claim 1, further comprising a step for forming at least one first group pillar in said first overhang space to enhance mechanical strength of said conductive gate material assembly, each of said first group pillars has a height defined by said first resist thickness, a length substantially equal to length of said first overhang space.

9. A process for fabricating a low-resistance gate structure as defined in claim 1, further comprising a step for forming at least one second group pillar in said second overhang space to enhance mechanical strength of said conductive gate material assembly, each of said second pillars has a height defined by said first resist thickness, a length substantially equal to length of said second overhang space.

10. A process for fabricating a low-resistance gate structure as defined in claim 1, further comprising a step of forming a third resist layer on said second resist layer, sensitivity of said third resist layer being selected to be substantially less than sensitivity of said second resist layer to said first radiation beam and said second radiation beam to form a overhangs in said third resist layer to facilitate a lift-off process.

11. A process for fabricating a low-resistance gate structure as defined in claim 1, in which step (e) further comprising a sub-step of treating said bi-layer resist structure to reduce the exposure and developing sensitivity of a top portion of said second resist layer in order to form overhangs to facilitate a lift-off process.

* * * * *